United States Patent [19]

Threewitt

[11] Patent Number: 4,780,845
[45] Date of Patent: Oct. 25, 1988

[54] HIGH DENSITY, DYNAMIC, CONTENT-ADDRESSABLE MEMORY CELL

[75] Inventor: N. Bruce Threewitt, Fremont, Calif.

[73] Assignee: Advanced Micro Devices, Inc., Sunnyvale, Calif.

[21] Appl. No.: 889,545

[22] Filed: Jul. 23, 1986

[51] Int. Cl.4 .............................................. G11C 15/00
[52] U.S. Cl. ...................................... 365/49; 365/182
[58] Field of Search ................. 365/49, 230, 189, 182; 371/21

[56] References Cited

U.S. PATENT DOCUMENTS 4,538,243  8/1985  Zehner .................................... 365/49
4,670,858  6/1987  Almy ...................................... 365/49
4,680,760  7/1987  Giles et al. ............................. 371/21

FOREIGN PATENT DOCUMENTS 3105503  9/1982  Fed. Rep. of Germany ........ 365/49

Primary Examiner—Joseph A. Popek
Attorney, Agent, or Firm—Eugene H. Valet; Patrick T. King

[57] ABSTRACT

A content-addressable memory cell and memory array are disclosed. Each cell comprises a random access memory storage component and a comparison component for performing the content addressability function. In a disclosed CMOS embodiment, a DRAM cell and an exclusive-NOR gate are combined to form the CAM cell.

12 Claims, 1 Drawing Sheet

HIGH DENSITY, DYNAMIC, CONTENT-ADDRESSABLE MEMORY CELL

BACKGROUND OF THE INVENTION

1. Field of the Invention

The present invention generally relates to digital memory and, more particularly, to associative or content-addressable memory (CAM) cell structures.

2. Description of the Related Art

A common type of READ/WRITE digital memory device is a random access memory (RAM) integrated circuit. In RAM devices, an address provided by a computer's central processing unit (CPU) or other addressing device specifies a unique storage location within the RAM array. The storage location can be a single bit, or a number of associated bits arranged as a digital word. Addresses are contiguous within a RAM device. As such, the RAM addressing structure is said to be unambiguous in that a RAM address specifies one—and only one—data storage location. Thus, there is a direct correlation between the width of the address field and memory storage capacity.

RAM devices are not suited for use in systems which process associative data. For example, the sequential access to data when addressing RAM is inefficient for systems involved in pattern recognition, natural language recognition, sparse matrix processing, and database interrogation. In such cases, the address associated with desired data may not be known. Hence, it may be desirable to interrogate the memory by supplying the desired data, after which the memory responds by indicating the absence or presence of the data and their associated address.

Another type of memory device which has been developed to have ambiguous and noncontiguous addressing is the CAM. Storage locations within CAM devices are addressed by an incoming bit pattern called a "comparand." Part of each storage location within the CAM can be considered to contain an associated address, whereas the remainder of the storage location can be considered to contain associated data. The comparand is compared, in parallel, to associated addresses of all storage locations: if the associated address has the desired relationship to the comparand, the associated data at that location are addressed.

Alternatively, the comparand can be compared to the entirety of the storage locations to detect whether the particular bit pattern corresponding to the comparand is stored within the CAM device. In other words, a number of storage locations within the CAM may contain the same associated address. "Masking" is used to mask certain bits of the comparand during a comparison function and to mask certain bits of the address during a WRITE operation. For example, during a COMPARE mode function, masked bits can be forced to provide a true comparison, if so desired. Thus, the system designer is permitted to use ambiguous content addressing.

CAM architectures and uses are described in U.S. patent application Ser. Nos. 807,577 (filed Dec. 11, 1985) and 817,230 (filed Jan. 8, 1986), assigned to the common assignee of the present invention.

A problem associated with known CAM devices is that the individual memory cell is much larger than a standard RAM cell. A static RAM cell (SRAM) typically uses a common flip-flop for each cell. A common cell has four transistors, two resistors and five interconnections. A typical dynamic RAM (DRAM) cell needs only a single storage component, such as a capacitor, and an accessing component, such as a transistor, which can be turned ON or OFF during memoy access. While the DRAM cell provides the capability of much denser and, therefore, large memory arrays on the same size chip, the capacitor-stored charges decay in a fraction of a second. Therefore, the charges have to be "refreshed" regularly. The CAM cell must also be able to signal exact matches or mismatches, as well as to be masked.

One CAM cell is taught by MUNDY, in U.S. Pat. No. 3,701,980. This structure uses four transistors. While simple, this structure has a low storage charge and provides little or no signal margin. It is, therefore, subject to soft errors and suffers from less than optimal performance.

Another CAM cell is shown in the IEEE IEDM 85, at pages 284-287: "Dynamic Cross-Coupled Bitline Content Addressable Memory Cell for High Density Arrays," by Wade and Sodini. Wade and Sodini discuss the problems of MUNDY and present an n-type metal-oxide-semiconductor structure (NMOS) having five transistors. This structure is concerned with the use of three states, 1, 0, and DON'T CARE; i.e., a CAM storage location will match the data on the bitlines if they both have the same logical value or if either the cell or bitline is a DON'T CARE. The storage on the gate of the ON transistor provides a higher storage node capacitance than in a standard DRAM cell.

Another CAM cell is taught in U.S. Pat. No. 4,404,653 (ZEHNER). The purpose of the structure of ZEHNER over the prior art is apparently to provide an additional TAG function.

The complexity of the known CAM cell structures has prevented the CAM devices from matching the density of SRAM devices and the speed and low-power requirements of common DRAM circuits, resulting in a high cost-per-bit factor. Therefore, there is a need for improvement in the CAM cell structures.

SUMMARY OF THE INVENTION

It is an object of the present invention to provide a CAM cell which is capable of integration into a high-density memory array without significant degradation in performance.

It is another object of the present invention to provide a CAM cell which simplifies manufacturing and provides a lower cost per bit.

It is still another object of the present invention to provide a CAM cell which is amenable to construction in a variety of semiconductor fabrication technologies.

In a basic aspect, the present invention provides a memory cell which is particularly suited to content-addressable memory systems, comprising a random access memory cell coupled to a bit line and a word line, and an exclusive NOR gate coupling said cell to a mask line and a match line.

Other objects, features and advantages of the present invention will become apparent upon consideration of the following detailed description and the accompanying drawings, in which like reference designations represent like features throughout the FIGURES.

The drawings referred to in this description should be understood as not being drawn to scale, except if specifically noted. Moreover, the drawings are intended to illustrate only one portion of an integrated circuit fabricated in accordance with the present invention.

DETAILED DESCRIPTION OF THE INVENTION

Reference is made now, in detail, to a specific embodiment of the present invention which illustrates the best mode presently contemplated by the inventor for practicing the invention. Alternative embodiments are also briefly described as applicable.

Figure 1:
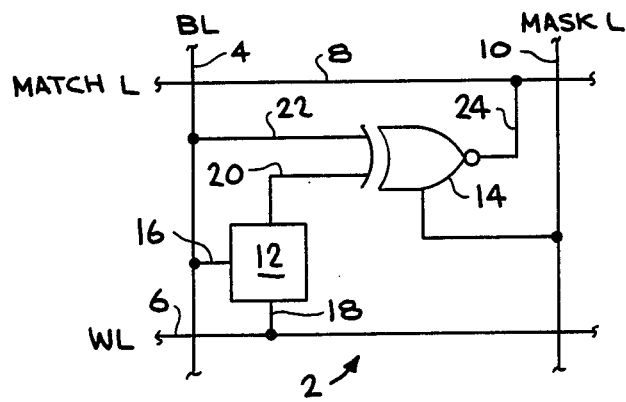
FIG. 1 is a schematic block diagram of the present invention.

Referring now to FIG. 1, a single cell 2 of the present invention is shown in a basic block diagram form. As will be obvious to a person skilled in the art, the invention can be implemented in many forms. For example, various integrated circuit technologies, such as bipolar, MOS, CMOS, BiMOS, etc., can be used to fabricate an integrated circuit (IC) CAM device having an array of cells made in accordance with this diagram.

Four signal lines 4, 6, 8, 10 form a matrix for the coupling of each cell 2. Obviously, an IC chip would have a large number of such cells. It is contemplated, for example, that an array of cells in a 4K×32 arrangement, viz., 4,096 thirty-two-bit words, or a 128K density chip, is possible using this cell structure 2 implemented in current CMOS technology for a die size of approximately 0.28 inches square.

The individual cell 2 has a storage component 12 and an exclusive-NOR gate coupled to the four signal lines 4, 6, 8, and 10, as described hereinafter.

The storage component 12 is a common RAM IC cell, viz., a DRAM cell in the present embodiment. As the structure and operation of DRAM cells are well known in the art, no detailed description is presented herein. Generally, a DRAM cell comprises a storage capacitor and an ON/OFF transistor used to access the cell during READ/WRITE/REFRESH modes of operation. Charges are put into the cell through the bit 4 line and word 6 line, and read out through the same lines. The bit line terminal of the storage component 12 is shown as line 16, and the word line terminal of the storage component 12 is shown as line 18.

The storage component 12 in the CAM cell must also be coupled to comparison component 14 in order to provide the capability of content addressability as discussed in the Background section above. In the present embodiment, the comparison component 14 is an exclusive-NOR (XNOR) gate 14, coupling the storage component 12 to the match line 8. An XOR gate is defined as a device or circuit with two, and only two, inputs of binary digital information and one output, which output is 1 when either input is 1, and which output is 0 when neither or both inputs are 1. The inverter on the gate output converts an XOR to an XNOR such that a 1 is output when the inputs are identical, and a 0 is output if the inputs differ.

The first input 20 of the XNOR gate 14 of the present embodiment is coupled to the output of the storage component 12. The second input 22 of the XNOR gate 14 is coupled to the bit line 4.

In operation, the XNOR gate 14 implements the Boolean equation:

$$A \text{ XNOR } B = (/A \cdot /B) + (A \cdot B)$$

where A and B are the input variables. In the case of a CAM cell, A and B are the contents of the memory and the comparand, respectively. Since masking, where individual bits are eliminated from the comparison, is useful, the extra interconnection represented by the mask line 10 is required. If the mask line 10 is HIGH, the mth bit of the comparand, $C_m$, will be forced to match on all words in the CAM array.

Note that the comparison function is isolated from the storage of the data except for the shared bit/comparand line. Therefore, the DRAM 12 READ/WRITE/REFRESH operations cannot be simultaneously executed with the COMPARE operation.

Figure 2:
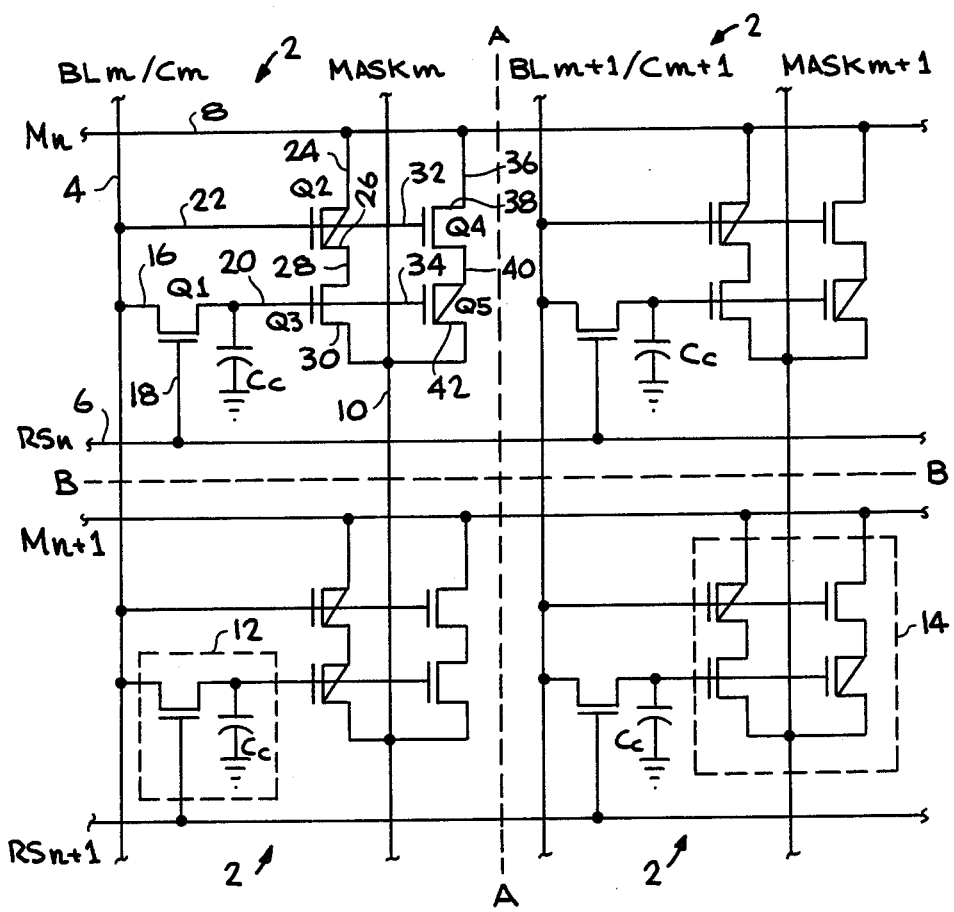
FIG. 2 is a schematic diagram showing an array of four cells of the present invention as shown in FIG. 1 as implemented in a complementary metal-oxide-semiconductor (CMOS) technology.

A CMOS exemplary embodiment of the present invention is shown in FIG. 2. The drawing shows an exemplary array of four of the dynamic CAM cells (divided by lines A—A and B—B) in accordance with the concept of the present invention.

The storage component 12 is a standard DRAM cell having one transistor Q1 and one capacitor Cc. The transistor is an n-channel metal-oxide-semiconductor field effect transistor (MOSFET) having a source/drain terminal coupled to the bit line 4 (also designated BLm/Cm since it has the dual function of serving as a data bit and comparand bit signal line).

The XNOR gate 14 has two pairs of complementary MOSFETs Q2, Q3, Q4, Q5. The first input 20 to the XNOR gate 14 is to the gate of n-channel MOSFET Q3 and p-channel MOSFET Q5, coupled to the DRAM cell 12 output. The second input 22 to the XNOR gate 14 is to the gate of p-channel MOSFET Q2 and n-channel MOSFET Q4, coupled to the bit line 4. MOSFET Q2 has one source/drain terminal 24 coupled to the match line 8 and its other source/drain terminal 26 coupled to a source/drain terminal 28 of the complementary MOSFET Q3 of the pair. The other source/drain terminal 30 of the MOSFET Q3 is coupled to the mask line 10.

MOSFET Q4 is an n-channel type, having one source/drain terminal 36 coupled to the match line 8 and its other source/drain terminal 38 coupled to a source/drain terminal 40 of the p-channel MOSFET Q5 of the pair. The other source/drain terminal 42 of the MOSFET Q5 is coupled to the mask line 10.

In operation, if the data stored in any cell in a given word are different from the data presented on the corresponding comparand line during a compare operation, either Q2/Q3 or Q4/Q5 pulls the match line 8 LOW, and that particular word does not MATCH. Conversely, the match line 8 can be HIGH (viz., a MATCH condition) only if the data in all cells in the word match the data presented on the corresponding comparand line, $C_m$, or if the corresponding mask line 10, MASKm, is HIGH for those cells whose data does not match the corresponding comparand line.

An alternative CMOS embodiment of the present invention would comprise an identical copy of FIG. 2 with the deletion of capacitor Cc. As will be recognized by one skilled in the art, capacitor Cc can be removed if MOSFETs Q3/Q5 are designed such that the gate storage properties are optimized. The data bit can be stored on the gate itself, thereby eliminating the need for capacitor Cc. With this modification, the cell is made even smaller, allowing for the fabrication of denser memory arrays.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. The embodiment was chosen and described in order to best explain the principles of the invention and its practical application, to thereby enable others skilled in the art to understand the invention for various embodiments and with various modifications as are suited to the particular use contemplated. It is intended that the scope of the invention be defined by the claims appended hereto and their equivalents.

What is claimed is:

1. A content-addressable memory cell, having four signal lines, comprising:
    a random access memory cell coupled to a bit line and to a word line wherein said random access memory cell comprises a first metal-oxide-semiconductor field effect transistor;
    an exclusive-NOR gate coupled to said cell and to said bit line and coupling said cell to a match signal line and to a mask signal line; and
    wherein said exclusive-NOR gate further comprises:
    two pairs of complementary metal-oxide-semiconductor field effect transistors;
    said first pair having a second transistor having a first source/drain terminal coupled to one of said mask lines, a gate terminal coupled to said bit line, and a second source/drain terminal coupled to said other transistor of said first pair, and a third transistor having a third source/drain terminal coupled to said second source/drain terminal, a gate terminal coupled to said cell transistor-second source/drain terminal, and a fourth source/drain terminal coupled to the second of said mash lines; and
    said second pair having a fourth transistor having a fifth source/drain terminal coupled to said same one of said mask lines as said second transistor, a gate terminal coupled to said bit line, and a sixth source/drain terminal coupled to the other transistor of said second pair, and a fifth transistor having a seventh source/drain terminal coupled to said sixth source/drain terminal, a gate terminal coupled to said cell transistor-second source/drain terminal, and an eighth source/drain terminal coupled to the second of said mask lines.

2. The memory cell as set forth in claim 1, wherein said exclusive-NOR gate implements a Boolean equation comprising:
$$A\ XNOR\ B = (/A \cdot /B) + (A \cdot B),$$
where A and B are input variables.

3. The memory cell as set forth in claim 2, wherein said input variables comprise:
    a signal from said bit line; and
    a signal from said random access memory cell.

4. The memory cell as set forth in claim 1, further comprising:
    said first transistor having a first source/drain terminal coupled to said bit line, a second source/drain terminal coupled to said exclusive-NOR gate, and a gate coupled to said word line.

5. The memory cell as set forth in claim 1, further comprising:
    a capacitor having a first terminal coupled to said second source/drain terminal, and a second terminal coupled to a circuit reference potential level.

6. The memory cell as set forth in claim 1, wherein said memory cell further comprises:
    the gate region of said third transistor.

7. The memory cell as set forth in claim 1, further comprising:
    said first, third and fourth transistors are n-channel type; and
    said second and fifth transistors are p-channel type.

8. An improved content-addressable memory, having a matrix array of signal lines having a plurality, m, of bit lines and a plurality, n, of word lines, and a plurality, n, of match lines and a plurality, m, of mask lines, and having a plurality of memory cells coupling said signal lines, characterized in that said memory cells each comprise:
    a random access memory component coupled to one of said bit lines and one of said work lines wherein said random access memory component comprises a first metal-oxide-semiconductor field effect transistor, said first transistor having a first source/drain terminal coupled to said bit line, a second drain terminal coupled to said exclusive-NOR gate, and a gate coupled to said word line;
    a capacitor having a first terminal coupled to said second source/drain terminal, and a second terminal coupled to a cicuit reference potential level; and
    an exclusive-NOR gate, having a first input coupled to said bit line and a second input coupled to said memory component and a comparison input coupled to one of said mask lines and an output coupled to one of said match lines, wherein said exclusive-NOR gate further comprises:
    two pairs of complementary metal-oxide-semiconductor field effect transistors;
    said first pair having a second transistor having a first source/drain terminal coupled to one of said mask lines, a gate terminal coupled to said bit line, and a second source/drain terminal coupled to said other transistor of said first pair, and a third transistor having a third source/drain terminal coupled to said second source/drain terminal, a gate terminal coupled to said cell transistor-second source/drain terminal, and a fourth source/drain terminal coupled to the second of said mask lines; and
    said second pair having a fourth transistor having a fifth source/drain terminal coupled to said same one of said mask lines as said second transistor, a gate terminal coupled to said bit line, and a sixth source/drain terminal coupled to the other transistor of said second pair, and a fifth transistor having a seventh source/drain terminal coupled to said sixth source/drain terminal, a gate terminal coupled to said cell transistor-second source/drain terminal, and an eighth source/drain terminal coupled to the second of said mask lines.

9. The memory cell as set forth in claim 8, wherein said exclusive-NOR gate implements a Boolean equation comprising:
$$A\ XNOR\ B = (/A \cdot B) + (A \cdot B),$$
where A and B are input variables.

10. The memory cell as set forth in claim 9, wherein said input variables comprise:
    a signal from said bit line; and
    a signal from said random access memory cell.

11. The memory cell as set forth in claim 8, wherein said memory component further comprises:
    the gate region of said third transistor.

12. The memory cell as set forth in claim 8, further comprising:
    said first, third and fourth transistors are n-channel types; and
    said second and fifth transistors are p-channel types.

* * * * *